United States Patent [19]

Sandhu et al.

[11] Patent Number: 5,298,463
[45] Date of Patent: Mar. 29, 1994

[54] METHOD OF PROCESSING A SEMICONDUCTOR WAFER USING A CONTACT ETCH STOP

[75] Inventors: Gurtej S. Sandhu; David A. Cathey, both of Boise, Id.

[73] Assignee: Micron Technology, Inc., Boise, Id.

[21] Appl. No.: 870,603

[22] Filed: Apr. 16, 1992

Related U.S. Application Data

[63] Continuation-in-part of Ser. No. 812,063, Dec. 17, 1991, Pat. No. 5,206,187, which is a continuation-in-part of Ser. No. 753,356, Aug. 30, 1991, abandoned.

[51] Int. Cl.⁵ .......................................... H01L 21/465
[52] U.S. Cl. ..................................... 437/192; 437/228; 437/200
[58] Field of Search ............... 437/228, 195, 192, 229; 148/147

[56] References Cited

U.S. PATENT DOCUMENTS

| 5,118,382 | 6/1992 | Cronin et al. | 156/643 |
| 5,157,002 | 10/1992 | Moon | 437/228 |
| 5,206,187 | 4/1993 | Doan | 437/192 |
| 5,219,793 | 6/1993 | Cooper et al. | 437/195 |
| 5,223,084 | 6/1993 | Uesato et al. | 156/644 |

FOREIGN PATENT DOCUMENTS

| 61-298464 | 12/1986 | Japan . |
| 64-20741 | 2/1989 | Japan . |
| 64-44264 | 2/1989 | Japan . |
| 64-253302 | 9/1989 | Japan . |
| 64-274909 | 10/1989 | Japan . |

OTHER PUBLICATIONS

Wolf et al., "Silicon Processing for the VLSI Era, vol. 1-Process Technology" pp. 402, 403, Lattice Press, Sunset Beach, Calif. (1986).
Tsunenari et al., "Electrical Characteristics Of Selective Tungsten Plugged Contacts Under The Optimized Conditions", present at the VLSI Conf. (1991).

*Primary Examiner*—Olik Chaudhuri
*Assistant Examiner*—Richard A. Booth
*Attorney, Agent, or Firm*—Wells, St. John, Roberts, Gregory & Matkin

[57] ABSTRACT

A method of processing a semiconductor wafer includes: a) fabricating a wafer to define a plurality of conductive regions, the conductive regions having outer surfaces positioned at varying elevations on the wafer thereby defining at least one high elevation conductive region and at least one low elevation conductive region; b) providing a planarized insulating dielectric layer atop the wafer; c) patterning the insulating dielectric layer for defining a plurality of contact openings through the insulating dielectric to selected conductive regions at the varying elevations; d) first etching the plurality of contact openings into the patterned insulating layer downwardly to stop at the high elevation conductive region outer surface to which electrical contact is to be made; e) after first etching, selectively depositing a layer of an etch stop material to a selected thickness atop the outer surface of the high elevation conductive region; and f) second etching the plurality of contact openings into the patterned insulating material to the low elevation conductive region outer surface to which electrical contact is to be made using the selectively deposited etch stop material layer over the high elevation conductive region as an etch stop protecting layer during such second etching. Photoresist may or may not remain in place during the second etching depending on insulating dielectric layer thicknesses.

31 Claims, 4 Drawing Sheets

METHOD OF PROCESSING A SEMICONDUCTOR WAFER USING A CONTACT ETCH STOP

RELATED PATENT DATA

This patent resulted from a continuation-in-part application of U.S. patent application Ser. No. 07/812,063, filed Dec. 17, 1991, which issued as U.S. Pat. No. 5,206,187 on Apr. 27, 1993, which resulted from a continuation-in-part application of U.S. patent application Ser. No. 07/753,356, filed Aug. 30, 1991, now abandoned.

TECHNICAL FIELD

This invention relates generally to semiconductor wafer processing, and more particularly to etching of contact openings through insulating dielectric layers to contacts on a wafer which are positioned at varying elevations.

BACKGROUND OF THE INVENTION

There is a continual goal in semiconductor wafer processing to maximize circuit density thereby minimizing the finished size of the semiconductor chip. One of the ways of minimizing the amount of surface area utilized for a given integrated circuit is to project the various devices and circuitry into the wafer, which is commonly known as vertical integration. As circuit complexity increases and vertical integration becomes more complex, the wafer topography becomes more and more varied. Differences in elevation might be as much as 50 to 100 percent or more across the die which can lead to severe problems in under-etching and over-etching of desired contacts. This gives rise to a need to etch contact/via openings of a given layer in multiple process steps because of a large variation in depth of the desired contacts at different points on the wafer.

The problem is diagrammatically illustrated by FIGS. 1 and 2. Referring to FIG. 1, a semiconductor wafer 10 includes a bulk substrate 12, field oxide regions 14, conductively doped silicon containing active regions 16a, 16b and 16c, and conductive runners 18a, 18b and 18c. The runners 18 are surrounded about their sides with spacer insulating material 20, which is typically oxide. A layer 22 of planarized dielectric oxide provides the top layer of the wafer. The goal or intent in the example is to etch contact openings to the upper surface of regions 16a, 16b and runner 18c. However, the elevation within dielectric layer 22 of the upper surface of runner 18c differs significantly from the elevation of the upper surfaces of regions 16a and 16b.

The problem during etch is illustrated by FIG. 2. Contact opening/vias 24a, 24b and 24c are illustrated as having been started within dielectric layer 22 over regions 16a, 16b and runner 18c, respectively. Opening 24c is illustrated as having been etched to the depth of the upper surface of runner 18c. However, further etching within dielectric layer 22 must occur for openings 24a and 24b to continue downwardly to the upper surfaces of regions 16a, 16b. During such continued etching, region 18c can be over etched, causing damage or destruction of runner 18c.

Typically, runner 18c will principally comprise silicon, such as conductively doped polysilicon, having an upper higher conductive silicide surface, such as $WSi_x$ or $TiSi_x$. Insulating dielectric layer 22 will typically be principally composed of $SiO_2$. Etch chemistries are preferably selected such that a greater amount of $SiO_2$ is removed during the etch than is polysilicon at the point where the etch reaches contact 18c. Nevertheless, etch of exposed material of runner 18c while etch of openings 24a and 24b continues can be significant, resulting in damage or circuit failure.

One typical present way of overcoming this drawback is to conduct the photomasking and etch of openings 24a and 24b separately from the etch for opening 24c. Such multiple steps for contact etch reduce throughput time, and correspondingly increase costs of the overall process.

It is an object of this invention to overcome these and other drawbacks associated with the prior art.

The present invention is particularly pointed out and distinctly claimed at the end of this specification. However, the structures and methods of operation of one or more preferred embodiments may best be understood by reference to the following description taken in connection with the accompanying drawings wherein like reference characters refer to like elements.

DETAILED DESCRIPTION OF PREFERRED EMBODIMENTS

Figure 1:
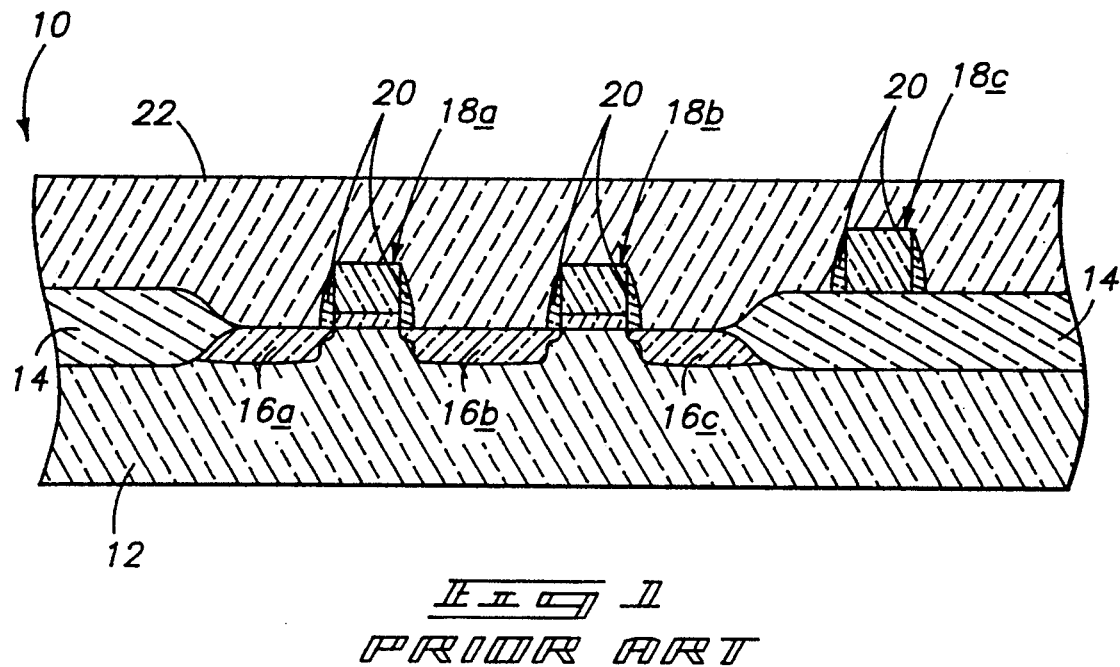
FIG. 1 is a diagrammatic cross-sectional view of a prior art wafer and is discussed in the "Background" section above.
Figure 2:
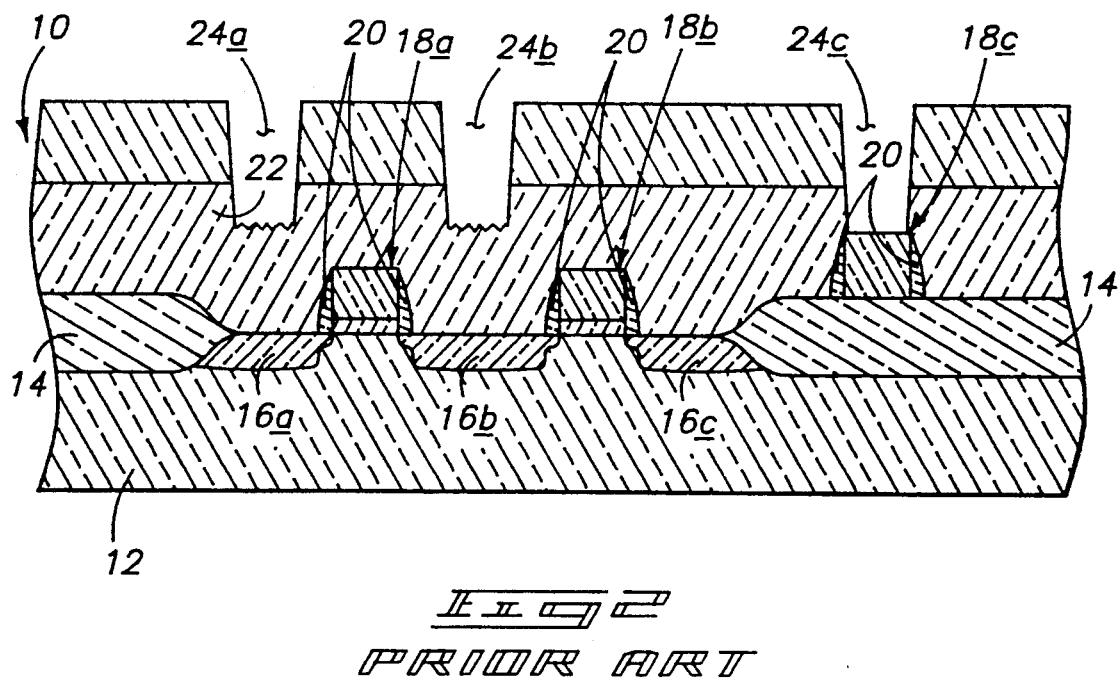
FIG. 2 is a diagrammatic section of the FIG. 1 wafer at a processing step subsequent to that illustrated by FIG. 1.

This disclosure of the invention is submitted in furtherance of the constitutional purposes of the U.S. Patent Laws "to promote the progress of science and useful arts" (Article 1, Section 8).

In accordance with one aspect of the invention, a method of processing a semiconductor wafer comprises the following steps:

fabricating a wafer to define a plurality of conductive regions, the conductive regions having outer surfaces positioned at varying elevations on the wafer thereby defining at least one high elevation conductive region and at least one low elevation conductive region;

providing a planarized insulating dielectric layer atop the wafer;

patterning the insulating dielectric layer for defining a plurality of contact openings through the insulating dielectric to selected conductive regions at the varying elevations;

first etching the plurality of contact openings into the patterned insulating layer downwardly to stop at the high elevation conductive region outer surface to which electrical contact is to be made;

after first etching, selectively depositing a layer of an etch stop material to a selected thickness atop the outer surface of the high elevation conductive region; and second etching the plurality of contact openings into the patterned insulating material to the low elevation conductive region outer surface to which electrical contact is to be made using the selectively deposited etch stop material layer over the high elevation conductive region as an etch stop protecting layer during such second etching.

In accordance with another aspect of the invention, a method of processing a semiconductor wafer comprises the following steps:

fabricating a wafer to define a plurality of conductive regions, the conductive regions having outer surfaces positioned at varying elevations on the wafer thereby defining at least one high elevation conductive region and at least one low elevation conductive region;

providing a planarized insulating dielectric layer atop the wafer;

providing a layer of photoresist atop the planarized insulating dielectric layer;

photo exposing and developing the photoresist to define a pattern of a plurality of selected openings through the photoresist to the insulating dielectric layer for definition of a plurality of contact openings through the insulating dielectric layer to conductive regions at the varying elevations;

first etching the plurality of contact openings into the patterned insulating layer downwardly to stop at the high elevation conductive region outer surface to which electrical contact is to be made;

after first etching and with the photoresist layer still in place, selectively depositing a layer of an etch stop material to a selected thickness atop the outer surface of the high elevation conductive region;

with the photoresist layer still in place, second etching the plurality of contact openings into the patterned insulating material to the low elevation conductive region outer surface to which electrical contact is to be made using the selectively deposited etch stop material layer over the high elevation conductive region as an etch stop protecting layer during such second etching; and removing photoresist from the wafer.

In accordance with still a further aspect of the invention, a method of processing a semiconductor wafer comprises the following steps:

fabricating a wafer to define a plurality of conductive regions, the conductive regions having outer surfaces positioned at varying elevations on the wafer thereby defining, a) a high elevation conductive region, b) a next highest elevation conductive region below the high elevation conductive region, and c) a low elevation conductive region;

providing a planarized insulating dielectric layer atop the wafer, the planarized insulating dielectric layer having an upper surface, the upper surface being elevationally separated from the outer surface of the next highest conductive region by a first distance;

providing a layer of photoresist atop the planarized insulating dielectric layer;

photo exposing and developing the photoresist to define a pattern of a plurality of selected openings through the photoresist to the insulating dielectric layer upper surface for definition of a plurality of contact openings through the insulating dielectric layer to conductive regions at the varying elevations;

first etching the plurality of contact openings into the patterned insulating layer downwardly to stop at the high elevation conductive region outer surface to which electrical contact is to be made and thereby defining contact opening first bases, the first etching leaving a second distance between the first bases and the outer surface of the low elevation conductive region, the first distance being greater than the second distance;

after first etching, selectively depositing a layer of an etch stop material to a selected thickness atop the outer surface of the high elevation conductive region;

after the first etching, removing all photoresist from the wafer; and with photoresist removed from wafer, second etching the plurality of contact openings into the patterned insulating material to the low elevation conductive region outer surface to which electrical contact is to be made using the selectively deposited etch stop material layer over the high elevation conductive region as an etch stop protecting layer during such second etching.

Figure 3:
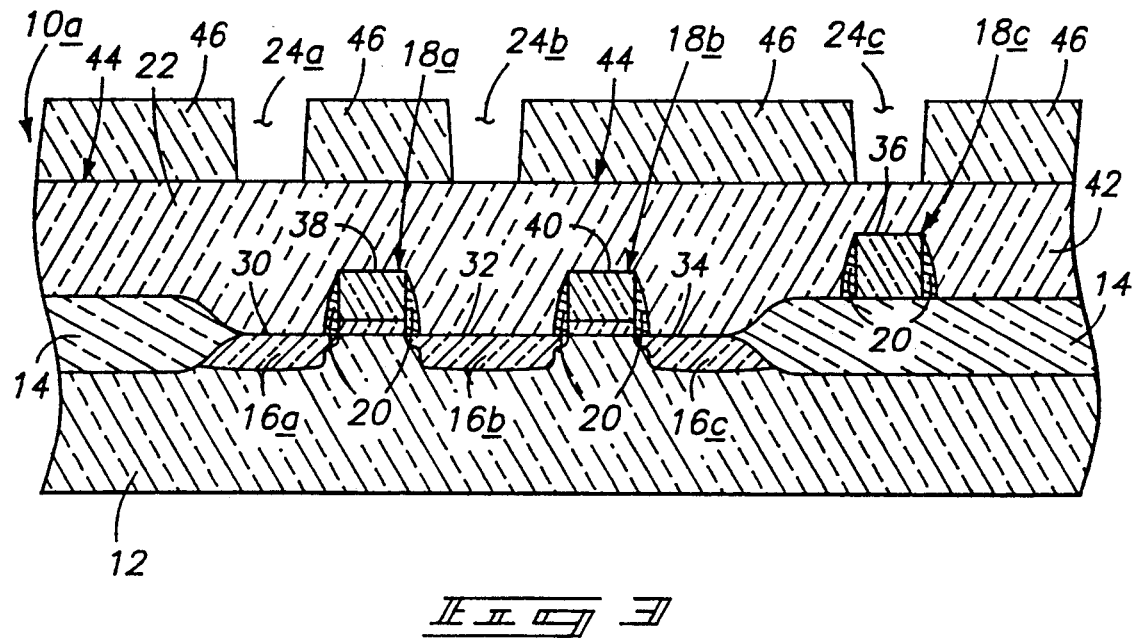
FIG. 3 is a diagrammatic section of a semiconductor wafer processed in accordance with the invention.
Figure 4:
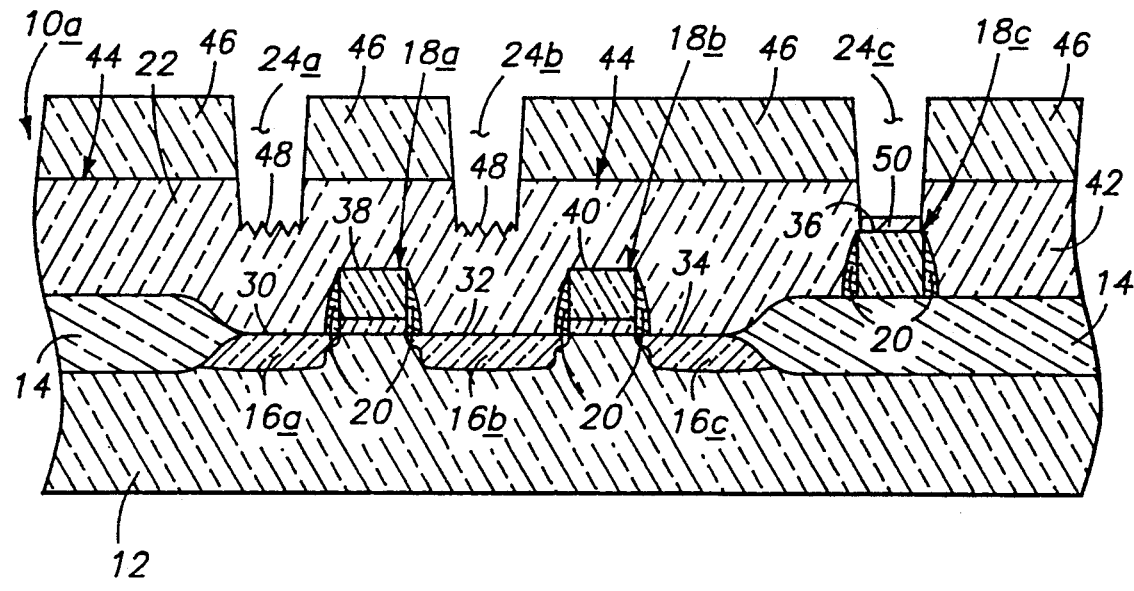
FIG. 4 is a diagrammatic section of the FIG. 3 wafer illustrated at a processing step subsequent to that shown by FIG. 3.
Figure 5:
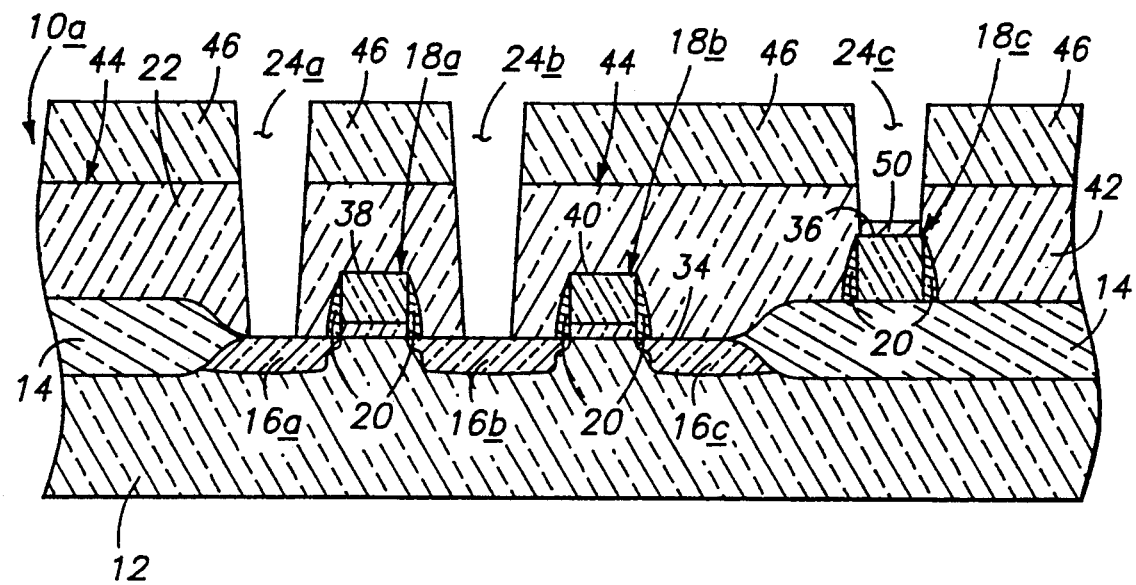
FIG. 5 is a diagrammatic section of the FIG. 3 wafer illustrated at a processing step subsequent to that shown by FIG. 4.

The discussion proceeds first with reference to FIGS. 3–5 with a description of one preferred embodiment. FIG. 3 illustrates the FIG. 1 wafer, now designated as wafer 10a, after formation of field oxide regions 14, active regions 16a, 16b and 16c, runners 18a, 18b and 18c, and spacer insulating oxide 20. For purposes of the continuing discussion, region 16a, 16b, 16c and runner 18c define a plurality of conductive regions having outer surfaces 30, 32, 34 and 36, respectively. Surface 36 is at an elevationally different or varied region from that of surfaces 30, 32 and 34 which are essentially at the same elevation. Runners 18a and 18b also have outer conductive surfaces 38 and 40, respectively, which are roughly at the same elevation. Outer surface 36 defines a high elevation conductive region, outer surfaces 38 and 40 define a next highest elevation conductive regions below the high elevation conductive region, and regions 30, 32 and 34 define low elevation conductive regions. The high and middle level elevation conductive regions will typically comprise a layer of silicide, such as $WSi_x$ or $TiSi_x$. The lower conductive regions will typically comprise conductively doped and activated silicon substrate regions.

A planarized insulating dielectric layer 42, having an upper surface 44, is provided atop the wafer as shown. An example material would be boron and/or phosphorus doped $SiO_2$. A layer 46 of photoresist is provided atop planarized insulating dielectric layer 42. Photoresist layer 46 is photo exposed and developed to define a pattern of a plurality of selected openings 24a, 24b and 24c through the photoresist to insulating dielectric layer upper surface 44 for definition of a plurality of contact openings through insulating dielectric layer 42 to conductive regions at the varying elevations. Thereby, insulating dielectric region 42 has been patterned for defining such contact openings.

Referring to FIG. 4 and with photoresist layer 46 still in place, contact openings 24a, 24b and 24c are first etched into insulating layer 42 downwardly to stop at high elevation conductive region outer surface 36 to which electrical contact is to be made. An example etch chemistry which is highly selective to polysilicon, $WSi_x$ and $TiSi_x$ is $CHF_3$ at 35 sccm, Ar at 60 sccm, and $CF_4$ at 25 sccm, at a power of 700 Watts. This thereby defines contact opening first bases 48 for contact openings 24a and 24b. After the first etching, a layer 50 of an etch stop material is selectively deposited to a selected thickness atop outer surface 36 of the high elevation conductive region. The preferred material for layer 50 is tungsten, which can be selectively deposited to adhere only to exposed silicon surfaces as is well known to people of skill in the art. As one example, Wolf et al., "Silicon Processing for the VLSI Era, Vol. 1-Process Technology" pp. 402, 403, *Lattice Press*, Sunset Beach, Calif. (1986) describes such a technique. Other operable etch stop materials, by way of example only, would include $TiSi_x$ and Al. Another example of such selective deposition is also disclosed in Tsunenari et al., "Electrical Characteristics Of Selective Tungsten Plugged Contacts Under The Optimized Condition", a paper presented at the VLSI Conference Proceedings in 1991.

Referring to FIG. 5 and with photoresist layer 46 still in place, contact openings 24a and 24b are second etched into patterned insulating material 42 to low elevation conductive region outer surfaces 30, 32 to which electrical contact is to be made while using etch stop layer 50 over high elevation conductive region outer surface 36 as an etch stop protecting layer during such second etching. Where layer 42 comprises $SiO_2$ and the material of layer 50 comprises W, an example etch chemistry would include the previously disclosed $CHF_3$ at 35 sccm, Ar at 60 sccm, and $CF_4$ at 25 sccm, at a power of 700 Watts. Such would provide a selective etch of $SiO_2$ relative to tungsten of 10:1. The selected thickness of layer 50 is chosen relative to the selective etch being conducted such that all of the material of layer 50 is not removed prior to the etch stopping on outer surfaces 30 and 32. An example preferred thickness for layer 50 is approximately 2000 Angstroms. Thereafter, photoresist layer 46 is removed from the wafer (not shown).

Etch stop layer 50 can comprise a material which is either electrically conductive or electrically non-conductive. An example electrically non-conductive material would include a nitride, such as $Si_3N_4$. Where the etch stop material is non-conductive, a further step is conducted to etch the etch stop material from the wafer after the second etching prior to the provision of a subsequent conductive material to fill contact opening 24c and thereby make electrical connection with component 18c.

Figure 6:
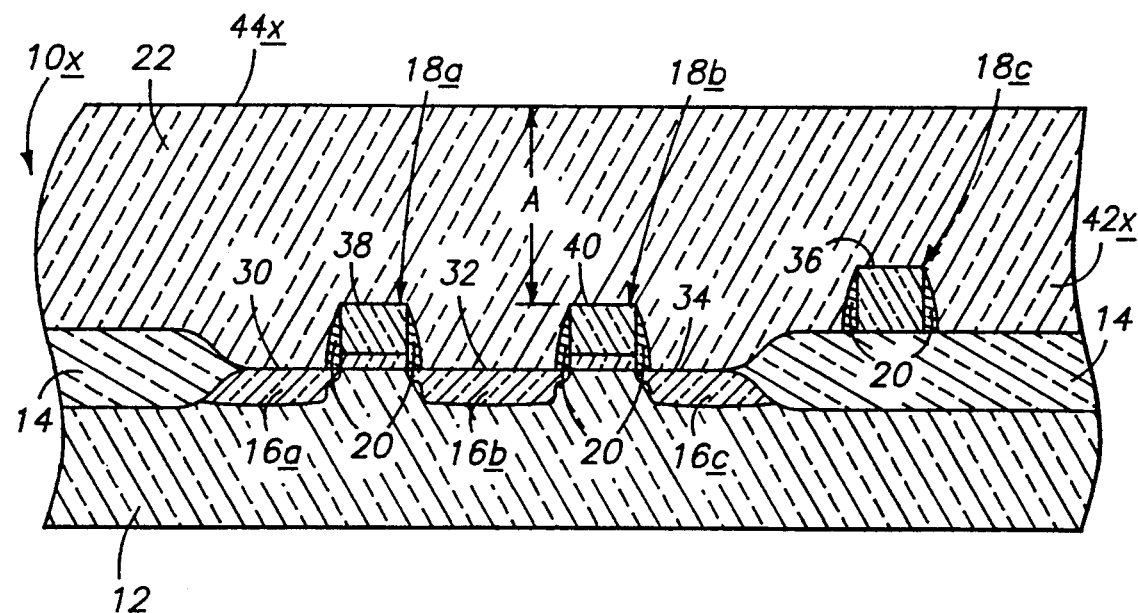
FIG. 6 is a diagrammatic section of an alternate semiconductor wafer processed in accordance with the invention.

An alternate method in accordance with the invention is described with reference to FIGS. 6-8. Like numerals have been utilized where appropriate in comparison with the FIGS. 3-5 embodiment, with the subscript small letter "x" being utilized for slightly different constructions in the FIGS. 6-8 embodiment. Specifically, FIG. 6 illustrates a modified wafer construction 10x. Wafer fragment 10x includes a dielectric layer 42x which has greater thickness than dielectric layer 42 of the 10a embodiment. For purposes of the continuing discussion, layer 42x has an upper surface 44x which is elevationally separated from outer surfaces 38, 40 (the next highest conductive region) by a first distance "A", as shown.

Figure 7:
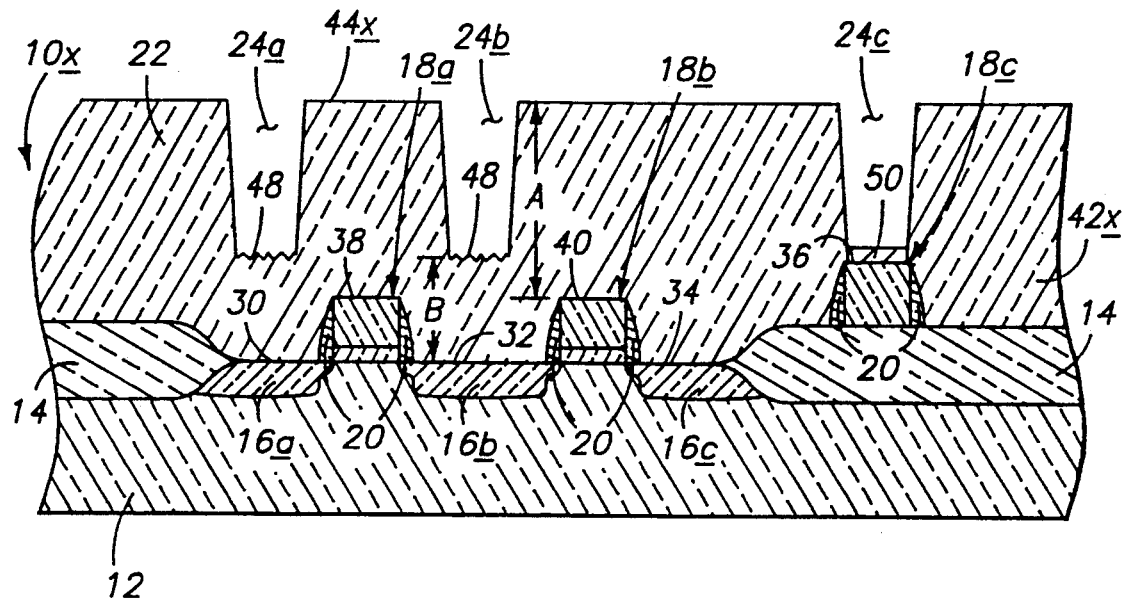
FIG. 7 is a diagrammatic section of the FIG. 6 wafer illustrated at a processing step subsequent to that shown by FIG. 6.
Figure 8:
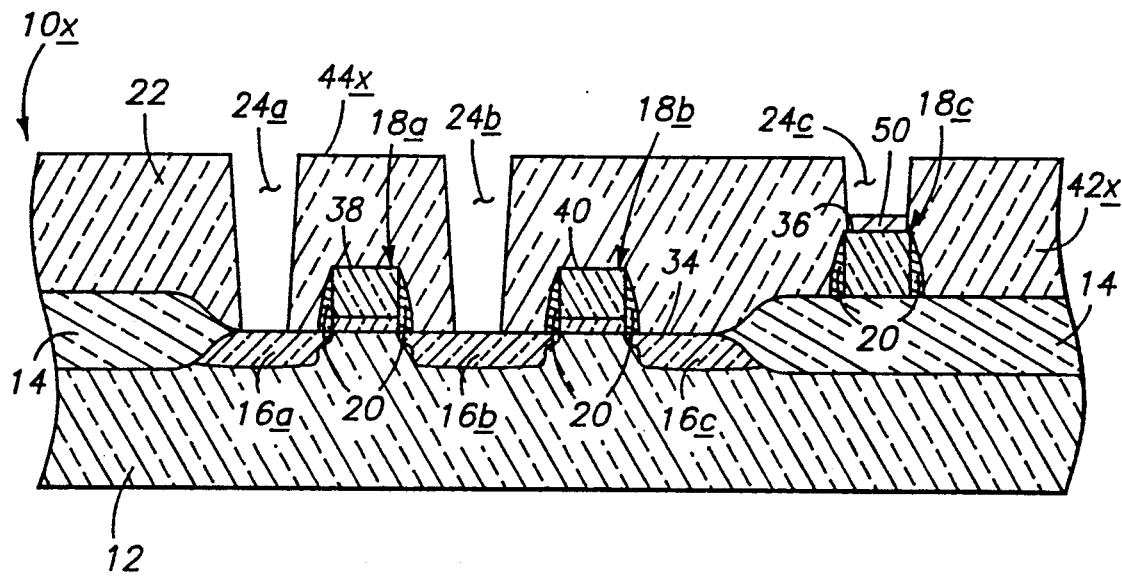
FIG. 8 is a diagrammatic section of the FIG. 6 wafer illustrated at a processing step subsequent to that shown by FIG. 7.

Referring to FIG. 7, photoresist has been applied and patterned, with contact openings 24a, 24b and 24c having been first etched to stop at high elevation conductive region outer surface 36. An etch stop layer 50 has been provided. Such first etching has left a second remaining etch distance "B" between first bases 48 of contact openings 24a and 24b and outer surfaces 30 and 32 of the low elevation conductive regions. First distance "A" is greater than second distance "B". The opposite relationship is true in the embodiment depicted in FIGS. 3-5.

Such "A" greater than "B" relationship enables subsequent etching of layer 42 to project contact openings 24a and 24b downwardly to outer surfaces 30, 32, respectively, without the use of photoresist. As the etching dimension "B" is less than the etching dimension "A", a timed etch stop can be designed to occur on layers 30 and 32 prior to sufficient material of layer 42 having been removed to undesirably upwardly expose upper surfaces 38 and 40. Preferably, the photoresist is removed from the wafer prior to selective deposition of layer 50.

The above described techniques provide effective ways to etch contacts/vias having various depths, and protects the material at the higher bases of the contacts from further etching. Such saves a mask step which is otherwise needed to effectively etch contacts at varying depths or elevation within a substrate.

The steps mentioned above can in principle be done in situ in the same system. For a multi-chamber system like AME5000, etching and selective deposition steps can be performed in the same chamber or two differnt chambers while keeping the wafers in vacuum.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of processing a semiconductor wafer comprising the following steps:

fabricating a wafer to define a plurality of conductive regions, the conductive regions having outer surfaces positioned at varying elevations on the wafer thereby defining at least one high elevation conductive region and at least one low elevation conductive region;

providing a planarized insulating dielectric layer atop the wafer;

patterning the insulating dielectric layer for defining a plurality of contact openings through the insulating dielectric to selected conductive regions at the varying elevations;

first etching the plurality of contact openings into the patterned insulating layer downwardly to stop at the high elevation conductive region outer surface to which electrical contact is to be made;

after first etching, selectively depositing a layer of an etch stop material to a thickness atop the outer surface of the high elevation conductive region; and second etching the plurality of contact openings into the patterned insulating material to the low elevation conductive region outer surface to which electrical contact is to be made using the selectively deposited etch stop material layer over the high elevation conductive region as an etch stop protecting layer during such second etching.

2. The method of processing a semiconductor wafer of claim 1 wherein the high elevation conductive region comprises a material selected from the group consisting of conductively doped silicon, $WSi_x$ or $TiSi_x$.

3. The method of processing a semiconductor wafer of claim 1 wherein the etch stop material is electrically conductive.

4. The method of processing a semiconductor wafer of claim 1 wherein the etch stop material is insulative, the method further comprising etching the etch stop material from the wafer after the second etching.

5. The method of processing a semiconductor wafer of claim 1 wherein the etch stop material comprises a material selected from the group consisting of W, $TiSi_2$, and Al.

6. The method of processing a semiconductor wafer of claim 1 wherein the etch stop material comprises W.

7. The method of processing a semiconductor wafer of claim 1 wherein the selected thickness of the etch stop material is approximately 2000 Angstroms.

8. The method of processing a semiconductor wafer of claim 1 wherein the etch stop material comprises a material selected from the group consisting of W, $TiSi_2$, and Al, and the selected thickness of the etch stop material is approximately 2000 Angstroms.

9. The method of processing a semiconductor wafer of claim 1 wherein the high elevation conductive region comprises a material selected from the group consisting of conductively doped silicon, $WSi_x$ or $TiSi_x$, and the etch stop material comprises W.

10. The method of processing a semiconductor wafer of claim 1 wherein the high elevation conductive region comprises a material selected from the group consisting of conductively doped silicon, $WSi_x$ or $TiSi_x$, the etch stop material comprises W, and the selected thickness of the etch stop material is approximately 2000 Angstroms.

11. A method of processing a semiconductor wafer comprising the following steps:

fabricating a wafer to define a plurality of conductive regions, the conductive regions having outer surfaces positioned at varying elevations on the wafer thereby defining at least one high elevation conductive region and at least one low elevation conductive region;

providing a planarized insulating dielectric layer atop the wafer;

providing a layer of photoresist atop the planarized insulating dielectric layer;

photo exposing and developing the photoresist to define a pattern of a plurality of selected openings through the photoresist to the insulating dielectric layer for definition of a plurality of contact openings through the insulating dielectric layer to conductive regions at the varying elevations;

first etching the plurality of contact openings into the patterned insulating layer downwardly to stop at the high elevation conductive region outer surface to which electrical contact is to be made;

after first etching and with the photoresist layer still in place, selectively depositing a layer of an etch stop material to a thickness atop the outer surface of the high elevation conductive region;

with the photoresist layer still in place, second etching the plurality of contact openings into the patterned insulating material to the low elevation conductive region outer surface to which electrical contact is to be made using the selectively deposited etch stop material layer over the high elevation conductive region as an etch stop protecting layer during such second etching; and removing photoresist from the wafer.

12. The method of processing a semiconductor wafer of claim 11 wherein the high elevation conductive region comprises a material selected from the group consisting of conductively doped silicon, $WSi_x$ or $TiSi_x$.

13. The method of processing a semiconductor wafer of claim 11 wherein the etch stop material is electrically conductive.

14. The method of processing a semiconductor wafer of claim 11 wherein the etch stop material is insulative, the method further comprising etching the etch stop material from the wafer after the second etching.

15. The method of processing a semiconductor wafer of claim 11 wherein the etch stop material comprises a material selected from the group consisting of W, $TiSi_2$, and Al.

16. The method of processing a semiconductor wafer of claim 11 wherein the etch stop material comprises W.

17. The method of processing a semiconductor wafer of claim 11 wherein the selected thickness of the etch stop material is approximately 2000 Angstroms.

18. The method of processing a semiconductor wafer of claim 11 wherein the etch stop material comprises a material selected from the group consisting of W, $TiSi_2$, and Al, and the selected thickness of the etch stop material is approximately 2000 Angstroms.

19. The method of processing a semiconductor wafer of claim 11 wherein the high elevation conductive region comprises a material selected from the group consisting of conductively doped silicon, $WSi_x$ or $TiSi_x$, and the etch stop material comprises W.

20. The method of processing a semiconductor wafer of claim 11 wherein the high elevation conductive region comprises a material selected from the group consisting of conductively doped silicon, $WSi_x$ or $TiSi_x$, and the selected thickness of the etch stop material is approximately 2000 Angstroms.

21. A method of processing a semiconductor wafer comprising the following steps:

fabricating a wafer to define a plurality of conductive regions, the conductive regions having outer surfaces positioned at varying elevations on the wafer thereby defining, a) a high elevation conductive region, b) a next highest elevation conductive region below the high elevation conductive region, and c) a low elevation conductive region;

providing a planarized insulating dielectric layer atop the wafer, the planarized insulating dielectric layer having an upper surface, the upper surface being elevationally separated from the outer surface of the next highest conductive region by a first distance;

providing a layer of photoresist atop the planarized insulating dielectric layer;

photo exposing and developing the photoresist to define a pattern of a plurality of selected openings through the photoresist to the insulating dielectric layer upper surface for definition of a plurality of contact openings through the insulating dielectric layer to conductive regions at the varying elevations;

first etching the plurality of contact openings into the patterned insulating layer downwardly to stop at the high elevation conductive region outer surface to which electrical contact is to be made and thereby defining contact opening first bases, the first etching leaving a second distance between the first bases and the outer surface of the low elevation conductive region, the first distance being greater than the second distance;

after first etching, selectively depositing a layer of an etch stop material to a thickness atop the outer surface of the high elevation conductive region;

after the first etching, removing all photoresist from the wafer; and with photoresist removed from wafer, second etching the plurality of contact openings into the patterned insulating material to the low elevation conductive region outer surface to which electrical contact is to be made using the selectively deposited etch stop material layer over the high elevation conductive region as an etch stop protecting layer during such second etching.

22. The method of processing a semiconductor wafer of claim 21 wherein the step of removing all the photoresist is conducted both after the first etching and prior to the selective depositing of the etch stop material.

23. The method of processing a semiconductor wafer of claim 21 wherein the high elevation conductive region comprises a material selected from the group consisting of conductively doped silicon, $WSi_x$ or $TiSi_x$.

24. The method of processing a semiconductor wafer of claim 21 wherein the etch stop material is electrically conductive.

25. The method of processing a semiconductor wafer of claim 21 wherein the etch stop material is insulative, the method further comprising etching the etch stop material from the wafer after the second etching.

26. The method of processing a semiconductor wafer of claim 21 wherein the etch stop material comprises a material selected from the group consisting of W, $TiSi_2$, and Al.

27. The method of processing a semiconductor wafer of claim 21 wherein the etch stop material comprises W.

28. The method of processing a semiconductor wafer of claim 21 wherein the selected thickness of the etch stop material is approximately 2000 Angstroms.

29. The method of processing a semiconductor wafer of claim 21 wherein the etch stop material comprises a material selected from the group consisting of W, $TiSi_2$, and Al, and the selected thickness of the etch stop material is approximately 2000 Angstroms.

30. The method of processing a semiconductor wafer of claim 21 wherein the high elevation conductive region comprises a material selected from the group consisting of conductively doped silicon, $WSi_x$ or $TiSi_x$, and the etch stop material comprises W.

31. The method of processing a semiconductor wafer of claim 21 wherein the high elevation conductive region comprises a material selected from the group consisting of conductively doped silicon, $WSi_x$ or $TiSi_x$, the etch stop material comprises W, and the selected thickness of the etch stop material is approximately 2000 Angstroms.

* * * * *